(12) United States Patent
Isa et al.

(10) Patent No.: US 9,159,663 B2
(45) Date of Patent: Oct. 13, 2015

(54) SEMICONDUCTOR DEVICE WITH RESPECTIVE ELECTRODE PAD ROWS AND RESPECTIVE EXTERNAL ELECTRODES ELECTRICALLY CONNECTED AND ARRANGED IN THE RESPECTIVE END PORTIONS OF THE SUBSTRATE

(75) Inventors: Satoshi Isa, Tokyo (JP); Hiromasa Takeda, Tokyo (JP); Kouji Sato, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 145 days.

(21) Appl. No.: 13/113,560

(22) Filed: May 23, 2011

(65) Prior Publication Data
US 2011/0291295 A1    Dec. 1, 2011

(30) Foreign Application Priority Data

May 27, 2010  (JP) .................................. 2010-121635

(51) Int. Cl.
*A63F 9/02* (2006.01)
*A63B 71/14* (2006.01)
(Continued)

(52) U.S. Cl.
CPC ...... *H01L 23/49838* (2013.01); *H01L 21/6836* (2013.01); *H01L 23/13* (2013.01); *H01L 24/49* (2013.01); *H01L 24/85* (2013.01); *H01L 24/97* (2013.01); *H01L 25/0657* (2013.01); *H01L 23/3128* (2013.01); *H01L 24/45* (2013.01); *H01L 24/48* (2013.01); *H01L 2221/68327* (2013.01); *H01L 2224/04042* (2013.01); *H01L 2224/06156* (2013.01); *H01L 2224/32145* (2013.01); *H01L 2224/32225* (2013.01); *H01L 2224/45144* (2013.01); *H01L 2224/45147* (2013.01);
(Continued)

(58) Field of Classification Search
CPC ......... H01L 24/85; H01L 24/49; H01L 24/97; H01L 23/49838; H01L 23/13; H01L 21/6836; H01L 25/0657
USPC .............. 257/782, E21.01, 777, E23.01, 686, 257/784; 438/109
See application file for complete search history.

(56) References Cited

U.S. PATENT DOCUMENTS 6,359,340 B1 * 3/2002 Lin et al. ........................ 257/777
7,485,953 B2 * 2/2009 Wu ................................ 257/686
(Continued)

FOREIGN PATENT DOCUMENTS

JP    2001-85609 A    3/2001
JP    2009-140995 A    6/2009

*Primary Examiner* — Peter Bradford (57) ABSTRACT

A semiconductor device comprises a substrate, pluralities of first and second external electrodes formed in two end portions of one surface of the substrate, a first semiconductor chip mounted on the other surface of the substrate, the first semiconductor chip having an electrode pad row formed in one end portion of one surface of the first semiconductor chip and electrically connected to the first external electrodes, the first semiconductor chip being disposed so that the one end portion of the first semiconductor chip is positioned on an end portion on which the first external electrodes of the substrate are formed, and a second semiconductor chip mounted on the first semiconductor chip, the second semiconductor chip having an electrode pad row formed in one end portion of one surface of the second semiconductor chip and electrically connected to the second external electrode, the second semiconductor chip being disposed so that the one end portion of the second semiconductor chip is positioned on an end portion on which the second external electrodes of the substrate are formed.

20 Claims, 10 Drawing Sheets

(51) Int. Cl.
*H01L 23/498* (2006.01)
*H01L 21/683* (2006.01)
*H01L 23/13* (2006.01)
*H01L 25/065* (2006.01)
*H01L 23/31* (2006.01)
*H01L 23/00* (2006.01)

(52) U.S. Cl.
CPC ............... *H01L2224/4824* (2013.01); *H01L 2224/48091* (2013.01); *H01L 2224/48227* (2013.01); *H01L 2224/49* (2013.01); *H01L 2224/49171* (2013.01); *H01L 2224/73215* (2013.01); *H01L 2224/73265* (2013.01); *H01L 2224/85* (2013.01); *H01L 2224/97* (2013.01); *H01L 2225/0651* (2013.01); *H01L 2225/06558* (2013.01); *H01L 2924/00014* (2013.01); *H01L 2924/0102* (2013.01); *H01L 2924/014* (2013.01); *H01L 2924/01005* (2013.01); *H01L 2924/01006* (2013.01); *H01L 2924/01029* (2013.01); *H01L 2924/01033* (2013.01); *H01L 2924/01079* (2013.01); *H01L 2924/15311* (2013.01)

(56) References Cited

U.S. PATENT DOCUMENTS

| | | | |
|---|---|---|---|
| 2002/0089050 A1* | 7/2002 | Michii et al. | 257/686 |
| 2003/0122239 A1* | 7/2003 | Song et al. | 257/686 |
| 2004/0026789 A1* | 2/2004 | Michii | 257/777 |
| 2005/0029645 A1* | 2/2005 | Mess et al. | 257/686 |
| 2005/0224946 A1* | 10/2005 | Dutta | 257/686 |
| 2005/0230801 A1* | 10/2005 | Kuroda et al. | 257/686 |
| 2007/0170575 A1* | 7/2007 | Lee et al. | 257/686 |
| 2007/0178622 A1* | 8/2007 | Liu et al. | 438/106 |
| 2007/0194415 A1* | 8/2007 | Seng et al. | 257/678 |
| 2008/0157393 A1* | 7/2008 | Kodama et al. | 257/777 |
| 2008/0197460 A1* | 8/2008 | Lee et al. | 257/670 |
| 2008/0197509 A1* | 8/2008 | Yamaguchi et al. | 257/777 |
| 2009/0032973 A1* | 2/2009 | Sasaki et al. | 257/777 |
| 2009/0045496 A1* | 2/2009 | Tian et al. | 257/686 |
| 2009/0065950 A1* | 3/2009 | Lee et al. | 257/777 |
| 2009/0127717 A1* | 5/2009 | Kang et al. | 257/777 |
| 2009/0140409 A1 | 6/2009 | Koshiishi et al. | |
| 2009/0140440 A1* | 6/2009 | Liu et al. | 257/777 |
| 2009/0278256 A1* | 11/2009 | Fan | 257/738 |

\* cited by examiner

SEMICONDUCTOR DEVICE WITH RESPECTIVE ELECTRODE PAD ROWS AND RESPECTIVE EXTERNAL ELECTRODES ELECTRICALLY CONNECTED AND ARRANGED IN THE RESPECTIVE END PORTIONS OF THE SUBSTRATE

BACKGROUND OF THE INVENTION

1. Field of the Invention

The present invention relates to semiconductor devices, and more particularly to Dual Die Package (DDP) semiconductor packages having two semiconductor chips stacked.

2. Description of the Related Art

In these years, for small-sized electronic devices such as a cellular telephone, there is an increasing demand that a semiconductor package (semiconductor device) that is to be mounted on a circuit board be denser in order to meet the downsizing and increased functionality of devices. In order to meet this demand, semiconductor packages having a plurality of semiconductor chips stacked are conceived. For one example, Dual Die Package (DDP) semiconductor packages are known, in which two semiconductor chips are stacked on a package substrate (wiring board).

In many DDP semiconductor packages, as disclosed in JP 2001-85609 A and JP 2009-140995 A, for example, a semiconductor chip having an electrode pad row formed on one surface thereof is used for a semiconductor chip to be mounted. The electrode pad row formed of a plurality of electrode pads is arranged along the center line in parallel with a pair of the opposing long sides of the semiconductor chip in a rectangular shape. The electrode pads are individually connected to a plurality of external electrodes formed on the surface opposite to the surface of a package substrate, on which the semiconductor chip is mounted, by means of wires or the like.

The above-mentioned electrode pad row on the semiconductor chip is classified into two sub-types. One row consists of command and address (CA) electrode pads, and the other row consists of data (DQ) signals and DQ power supply/DQ ground, i.e., Input/Output (I/O) electrode pads. These sub-types of electrode pad rows are arranged in series in such a way that a row of the I/O electrode pads is located on one end portion of the semiconductor chip and a row of the CA electrode pads is located on the other end portion.

On the other hand, in the external electrodes provided on the package substrate, the external electrodes connected to the I/O electrode pad row are arranged near a pair of the opposing sides of the package substrate in a rectangular shape, that is, they are arranged as divided into two regions. Such an arrangement is provided in order to improve symmetry in a memory chip, to accelerate the speed of the device, and to facilitate wiring in mounting the semiconductor package on the packaging substrate. The arrangement is defined according to standards or the like.

Now, in order to achieve high speed operations in the DDP semiconductor package, it is necessary to prevent the wire length between the semiconductor chip and the external electrodes from varying from chip to chip. This is because the difference in the wire length causes an increase in the input or input/output capacitance of the external electrode having a long wire length as well as causes increased variations in signal delay time (timing), resulting in an obstacle against high speed signaling. Thus, in the case of using the semiconductor chip and the package substrate as described above, it is necessary to design the semiconductor package also taking into consideration the configurations of individual electrode pads and external electrodes. However, no DDP semiconductor packages have been disclosed that are designed by taking into consideration this point. JP 2001-85609 A originally pays no attention to variations in delay time between semiconductor chips. In JP 2009-140995 A, the relative dielectric constant of an encapsulation resin is adjusted to control variations in delay time, but this does not take into account the configurations of the electrode pads and external electrodes.

From the above discussion, the requirement is that, as regards semiconductor devices that have a plurality of semiconductor chips stacked on a substrate, the difference in the wire length between each of the individual semiconductor chips that are to be stacked be reduced and variations in signal delay time be eliminated.

SUMMARY

In one embodiment, there is provided a semiconductor device that comprises a substrate, pluralities of first and second external electrodes formed in two end portions of one surface of the substrate, a first semiconductor chip mounted on the other surface of the substrate, the first semiconductor chip having an electrode pad row formed in one end portion of one surface of the first semiconductor chip and electrically connected to the first external electrodes, the first semiconductor chip being disposed so that the one end portion of the first semiconductor chip is positioned on an end portion on which the first external electrodes of the substrate are formed, and a second semiconductor chip mounted on the first semiconductor chip, the second semiconductor chip having an electrode pad row formed in one end portion of one surface of the second semiconductor chip and electrically connected to the second external electrode, the second semiconductor chip being disposed so that the one end portion of the second semiconductor chip is positioned on an end portion on which the second external electrodes of the substrate are formed.

In another embodiment, there is provided a semiconductor device that comprises a substrate, pluralities of first and second external electrodes formed in two end portions of one surface of the substrate, and two semiconductor chips stacked on the other surface of the substrate, a first semiconductor chip being mounted on the substrate, a second semiconductor chip being mounted on the first semiconductor chip. The first semiconductor chip has first and second electrode pad rows formed on one surface of the first semiconductor chip and arranged in series, the first electrode pad row being positioned on one end portion of the one surface and electrically connected to the first external electrodes, the second electrode pad row being positioned on the other end portion of the one surface. The second semiconductor chip has first and second electrode pad rows formed on one surface of the second semiconductor chip and arranged in series, the first electrode pad row being positioned on one end portion of the one surface and electrically connected to the second external electrodes, the second electrode pad row being positioned on the other end portion of the one surface. The two semiconductor chips are stacked on the substrate so that the first electrode pad row on the first semiconductor chip is positioned on an end portion on which the first external electrodes of the substrate are formed and the first electrode pad row on the second semiconductor chip is positioned on an end portion on which the second external electrodes on the substrate are formed.

In such a semiconductor device, the first and second semiconductor chips stacked on the substrate are configured to be disposed in such a way that the electrode pad row on each semiconductor chip and the external electrodes electrically connected thereto are arranged in the same end portions of the substrate. More specifically, the first external electrodes and the electrode pad row on the first semiconductor chip electrically connected to the first external electrodes are arranged on one end portion of the substrate. On the other hand, the second external electrodes and the electrode pad row on the second semiconductor chip electrically connected to the second external electrodes are arranged on the other end portion of the substrate. Accordingly, the wire length from the electrode pad row on each of the first and second semiconductor chips to the external electrodes are made equal, so that it is possible to reduce the difference in the wire length between the semiconductor chips, and to eliminate variations in signal delay time.

BRIEF DESCRIPTION OF THE DRAWINGS

The above features and advantages of the present invention will be more apparent from the following description of certain preferred embodiments taken in conjunction with the accompanying drawings, in which:

FIGS. 9A to 10 are plan views schematically showing the semiconductor device according to the third embodiment of the present invention.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

First, the configuration of a semiconductor device according to a first embodiment of the present invention will be described with reference to FIGS. 1 to 4.

Figure 1:
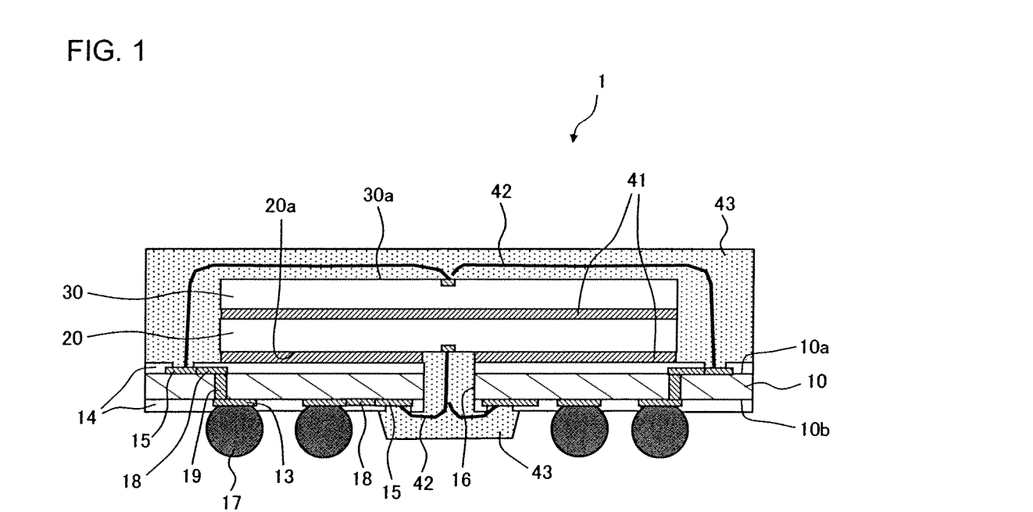
FIG. 1 is a cross sectional view schematically showing a semiconductor device according to a first embodiment of the present invention.
Figure 2:
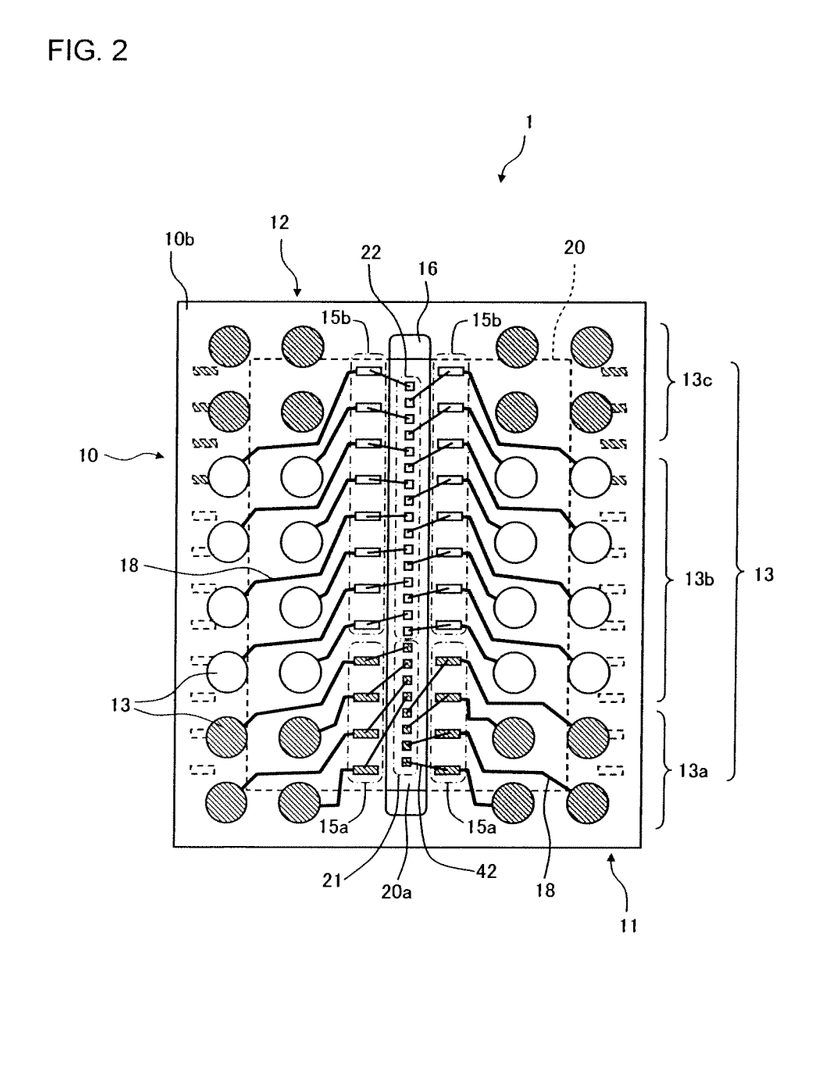
FIGS. 2 to 4 are plan views schematically showing the semiconductor device according to the first embodiment of the present invention.
Figure 3:
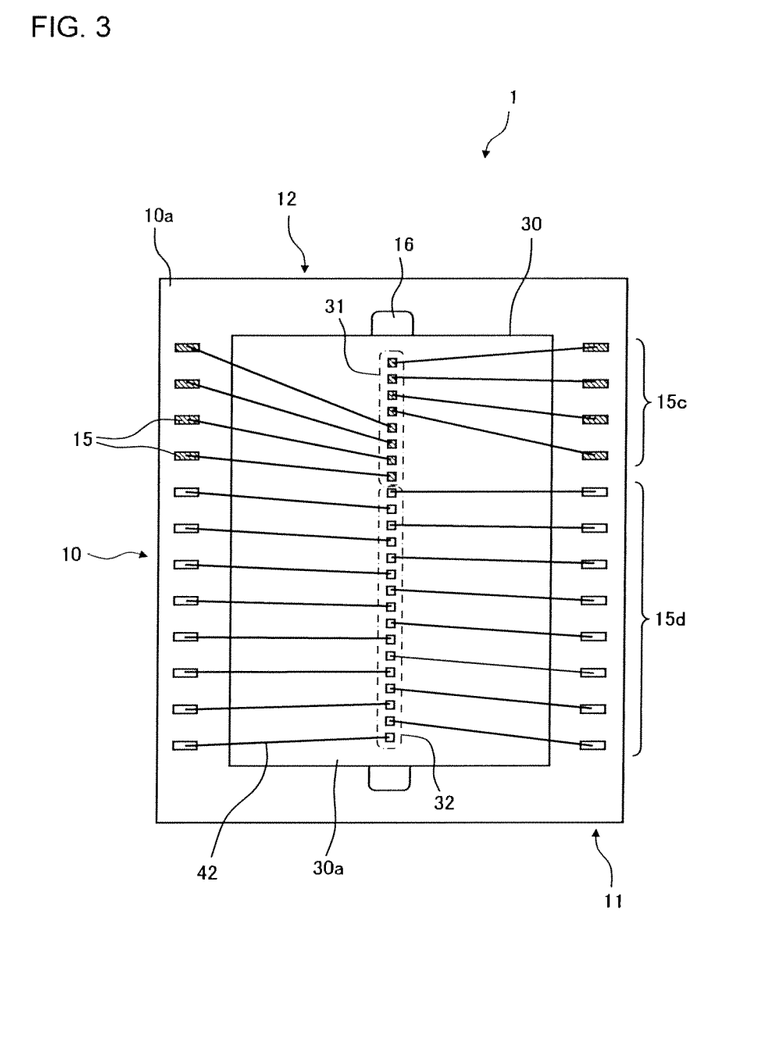
Figure 4:
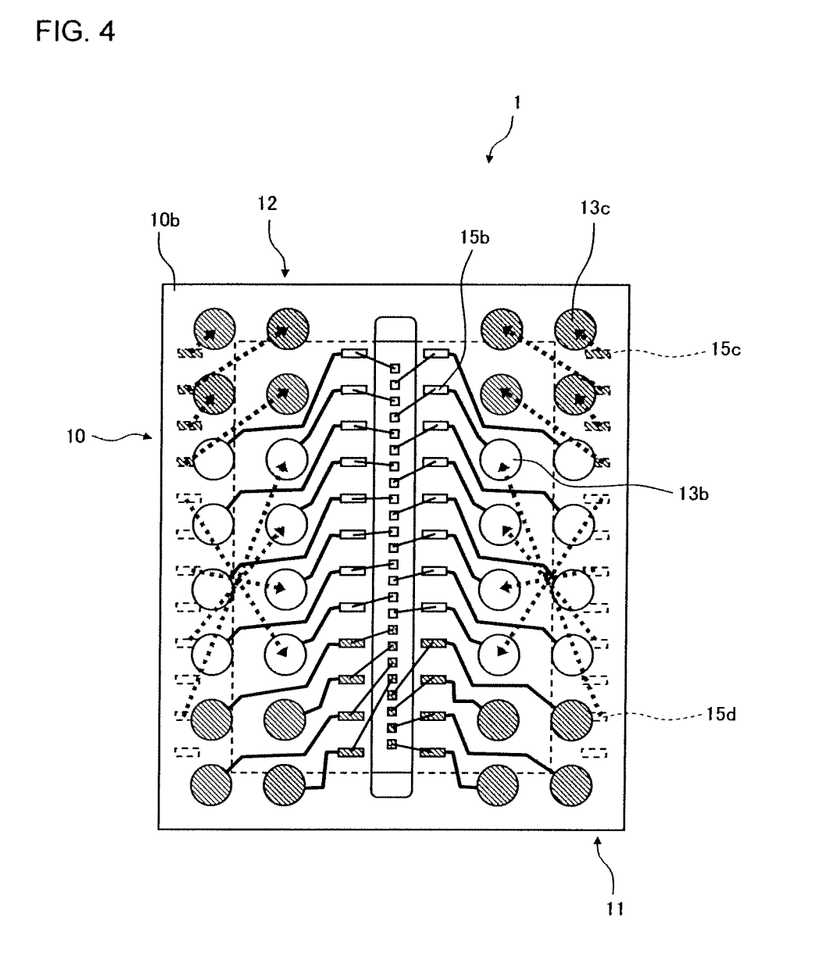

FIG. 1 is a cross sectional view schematically showing a semiconductor device according to this embodiment that is a Dual Die Package (DDP) semiconductor package having two semiconductor chips stacked, showing a cross section in the direction vertical to a substrate. FIGS. 2 and 3 are schematic plan views showing the semiconductor device shown in FIG. 1. FIG. 2 shows an electrode forming surface on which a plurality of lands (external electrodes) are formed, and FIG. 3 shows a chip mounting surface on which semiconductor chips are stacked. It should be noted that an encapsulation element shown in FIG. 1, that covers the front surface of the semiconductor device, is not shown in FIGS. 2 and 3 in order to illustrate the internal configuration of the semiconductor device. FIG. 4 is a schematic plan view showing the semiconductor device according to this embodiment corresponding to FIG. 2, showing the chip mounting surface.

Semiconductor device 1 according to this embodiment has wiring board 10 formed of a glass epoxy base material (insulating substrate) having a thickness of 0.2 mm, for example. Wiring board 10 is formed in an almost rectangular shape as shown in FIGS. 2 and 3.

As shown in FIG. 1, wiring board 10 has chip mounting surface 10a, on which two semiconductor chips 20 and 30 are stacked, and electrode forming surface 10b opposite to chip mounting surface 10a. On both surfaces 10a and 10b of wiring board 10, predetermined wires 18 made of a conductive material such as Cu are formed and partially covered with an insulating film, e.g. solder resist 14. Bond fingers 15 are individually formed in the regions exposed from this solder resist 14 on chip mounting surface 10a and electrode forming surface 10b. Moreover, on electrode forming surface 10b, a plurality of lands (external electrodes) 13 are formed, on each of which solder ball 17 is mounted. Lands 13 are electrically connected to bond fingers 15 on electrode forming surface 10b through wires 18, and electrically connected to bond fingers 15 on chip mounting surface 10a through wires 18 and through vias 19 formed on wiring board 10.

Near the center of wiring board 10, opening 16 is formed to penetrate through wiring board 10. As shown in FIG. 2, opening 16 is formed along the center line in parallel with a pair of the opposing long sides of rectangular wiring board 10 and is located at the position corresponding to electrode pad rows 21 and 22 on first semiconductor chip 20, described later, which is mounted on chip mounting surface 10a.

As shown in FIG. 2, lands 13a to 13c formed on electrode forming surface 10b of wiring board 10 are arranged in a grid at predetermined intervals. Lands 13 are electrically connected to electrode pads 21, 22, 31, and 32 formed on semiconductor chips 20 and 30, described later, through bond fingers 15a to 15d on electrode forming surface 10b and chip mounting surface 10a. Thus, lands 13 are classified into two types according to input and output signals of electrode pads 21, 22, 31, and 32 of semiconductor chips 20 and 30. One set of lands is Input/Output (I/O) lands 13a and 13c connected to data (DQ) signals and DQ power supply/DQ ground, i.e., Input/Output electrode pads (I/O pads) 21 and 31. The other set of lands is command and address (CA) lands 13b connected to command and address electrode pads (CA pads) 22 and 32.

As shown in FIG. 2, I/O lands 13a and 13c are arranged separately on both end portions of electrode forming surface 10b, and I/O lands 13a and 13c arranged in the individual end portions are respectively allocated to two semiconductor chips 20 and 30 mounted on wiring board 10. More specifically, in lower end portion (first end portion) 11 of FIG. 2, I/O lands (first external electrodes) 13a are arranged for first semiconductor chip 20 disposed on the wiring board 10 in the stacked semiconductor chips. In addition, in upper end portion (second end portion) 12 of FIG. 2, I/O lands (second external electrode) 13c are arranged for second semiconductor chip 30 mounted on first semiconductor chip 20. CA lands 13b are arranged between these I/O lands 13a and 13c.

As shown in FIG. 1, on chip mounting surface 10a of wiring board 10, first semiconductor chip 20 is mounted through adhesive member 41 such as a DAF (Die Attached Film) or elastomer. As shown in FIG. 2, first semiconductor chip 20 is formed in an almost rectangular plate shape, having pad forming surface 20a on one surface, on which a memory circuit, for example, and a plurality of electrode pads are formed. A plurality of the electrode pads are arranged along the center line in parallel with a pair of the opposing long sides of rectangular first semiconductor chip 20, which constitute electrode pad rows 21 and 22. As described above, in these electrode pad rows 21 and 22, I/O pad row (first electrode pad row) 21 is formed of I/O electrode pads (I/O pads) and CA pad row (second electrode pad row) 22 is formed of CA electrode pads (CA pads). These pad rows 21 and 22 are arranged in series in a straight line; I/O pad row 21 is positioned on one end portion of first semiconductor chip 20, and CA pad row 22 is positioned on the other end portion. In addition, on pad forming surface 20a of first semiconductor chip 20, except for electrode pads 21 and 22, a passivation film (not shown) is formed for protecting the circuit forming surface.

First semiconductor chip 20 is disposed on wiring board 10 in such a way that pad forming surface 20a faces wiring board 10 and electrode pad rows 21 and 22 mentioned above are exposed from opening 16 in wiring board 10. In this case, first semiconductor chip 20 is disposed in such a way that one end portion of first semiconductor chip 20 is positioned on first end portion 11 of wiring board 10. More specifically, first semiconductor chip 20 is disposed in such a way that I/O pad row 21 arranged in one end portion of first semiconductor chip 20 is provided next to I/O lands 13a for first semiconductor chip 20 arranged in first end portion 11 of wiring board 10. This layout of the I/O pad row and the I/O lands is one of the significant features of the present invention.

Electrode pad rows 21 and 22 on first semiconductor chip 20 are respectively connected to corresponding bond fingers 15a and 15b on electrode forming surface 10b using conductive wires 42 made of Au, Cu, or the like, for example, through opening 16 in wiring board 10, so that they are electrically connected to each other. In addition, bond fingers 15a and 15b on electrode forming surface 10b are arranged on both sides of opening 16 and therealong. Similar to I/O lands 13a, I/O bond fingers 15a connected to I/O pads 21 on first semiconductor chip 20 are arranged in first end portion 11 of wiring board 10 (on the lower side of FIG. 2).

In addition, opening 16 is provided in wiring board 10 and first semiconductor chip 20 is mounted on wiring board 10 in such a way that a plurality of electrode pads 21 and 22 are exposed from opening 16, yielding another advantage in that it is possible to reduce the overall thickness of semiconductor device 1.

As shown in FIG. 1, second semiconductor chip 30 in the same configuration as that of first semiconductor chip 20 is stacked on first semiconductor chip 20 by means of adhesive member 41 such as a DAF or the like.

First and second semiconductor chips 20 and 30 are stacked on chip mounting surface 10a of wiring board 10 in such a way that the surfaces on which the electrode pads are not formed face each other. In other words, as shown in FIG. 3, second semiconductor chip 30 is mounted on first semiconductor chip 20 in such a way that pad forming surface 30a faces the outside. In this case, second semiconductor chip 30 is disposed in such a way that one end portion of second semiconductor chip 30 is positioned on second end portion 12 of wiring board 10 (on the upper side of FIG. 3). More specifically, in second semiconductor chip 30, I/O pad row 31 arranged in one end portion of second semiconductor chip 30 is provided adjacent to I/O lands 13c for second semiconductor chip 30 arranged in second end portion 12 of wiring board 10 (electrode forming surface 10b) in the direction orthogonal to the board surface of wiring board 10. This layout of the I/O pad row and the I/O lands in second semiconductor chip 30 is the same as the case of first semiconductor chip 20.

Electrode pads 31 and 32 on second semiconductor chip 30 are connected to bond fingers 15c and 15d on chip mounting surface 10a of wiring board 10 using conductive wires 42 made of Au, Cu, or the like, for example, so that they are electrically connected to each other. In addition, bond fingers 15c and 15d on chip mounting surface 10a are arranged along and near the two long sides of wiring board 10 in parallel with the direction of extending elongated opening 16. Similar to I/O lands 13c on electrode forming surface 10b (see FIG. 2), I/O bond fingers 15c connected to I/O pads 31 on second semiconductor chip 30 are arranged in second end portion 12 of wiring board 10 (on the upper side of FIG. 3).

FIG. 4 schematically shows the connections between bond fingers 15c and 15d on chip mounting surface 10a and lands 13a and 13c on electrode forming surface 10b shown in FIG. 3 by dotted arrows.

As shown in FIG. 4, I/O bond fingers 15c arranged in second end portion 12 of chip mounting surface 10a are electrically connected to I/O lands 13c arranged in second end portion 12 of electrode forming surface 10b via the predetermined wires and through vias described above. On the other hand, CA bond fingers 15d on chip mounting surface 10a are similarly electrically connected to CA lands 13b arranged near the center of electrode forming surface 10b via the predetermined wires and through vias described above. CA bond fingers 15b on electrode forming surface 10b are also connected to these CA lands 13b. Thus, CA bond fingers 15b and 15d for first and second semiconductor chips 20 and 30 are electrically connected to shared CA lands 13b. In addition, bond fingers 15c and 15d on chip mounting surface 10a are routed in predetermined wiring patterns on chip mounting surface 10a, and electrically connected to lands 13a and 13b on electrode forming surface 10b via through vias. Because of this, it is possible to readily route bond fingers 15c and 15d on chip mounting surface 10a regardless of the wiring patterns on electrode forming surface 10b.

In addition, as shown in FIG. 1, on chip mounting surface 10a of wiring board 10 and near opening 16, encapsulation element 43 made of a thermosetting resin such as epoxy resin is formed. Wires 42 that connect two semiconductor chips 20 and 30 to each other and semiconductor chips 20 and 30 to bond fingers 15 are covered with this encapsulation element 43 for external protection.

As discussed above, in semiconductor device 1 according to this embodiment, electrode rows 21, 31 that belong to the Input/Output (I/O) signal lines for semiconductor chips 20 and 30 as well as lands 13a and 13c are arranged in same end portions 11 and 12 of wiring board 10. More specifically, I/O pad row 21 of first semiconductor chip 20 as well as I/O lands 13a for first semiconductor chip 20 are arranged in first end portion 11 of wiring board 10. On the other hand, I/O pad row 31 of second semiconductor chip 30 as well as I/O lands 13c for second semiconductor chip 30 is arranged in second end portion 12 of wiring board 10. Because of this, it is possible that the wire length from I/O pad rows 21 and 31 to I/O lands 13a and 13c is made equal between first and second semiconductor chips 20 and 30, that is, the difference in the wire length is reduced. For this reason, it is possible to reduce the difference in the input/output capacitance of the I/O signal line between first and second semiconductor chips 20 and 30, and to reduce variations in delay time (timing). As a result, it is possible to implement a DDP semiconductor device that is operable at faster speeds.

Next, a method of fabricating the semiconductor device according to this embodiment will be described with reference to FIGS. 5A to 5E.

FIGS. 5A to 5E are schematic cross sectional views showing the semiconductor device in process steps of a method of fabricating the semiconductor device according to this embodiment.

First, a circuit motherboard is prepared. The circuit motherboard for use in this embodiment is processed by Mold Array Process (MAP) and comprises a plurality of product forming regions arranged in a matrix. The product forming region is a region that is to be the foregoing wiring board after being cut and separated, and a dicing line is provided between the individual product forming regions. In addition, the opening is also formed in the individual product forming regions. A frame portion is provided around each of the product forming regions arranged in a matrix, and a tooling hole used for carrying and positioning the circuit motherboard is provided in the frame portion at predetermined intervals.

Figure 5A:
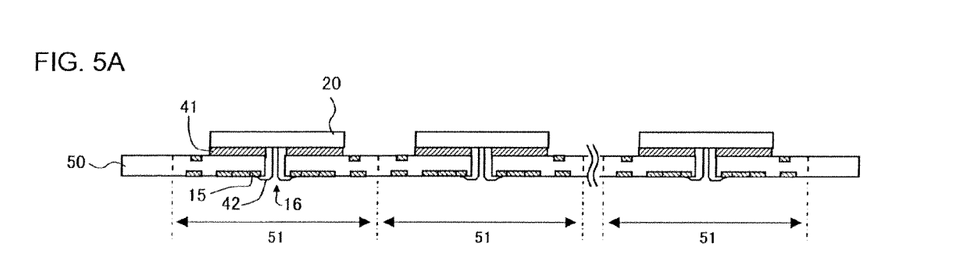
FIGS. 5A to 5E are step diagrams illustrating a method of fabricating the semiconductor device according to the first embodiment of the present invention.

Subsequently, as shown in FIG. 5A, first semiconductor chip 20 is bonded and fixed on each of product forming regions 51 of circuit motherboard 50 by means of adhesive member 41 such as a DAF, a tape member having, for example, an adhesive layer on both surfaces of an insulating base material, or an elastomer. In this case, first semiconductor chip 20 is disposed in such a way that the pad forming surface of first semiconductor chip 20 faces product forming region (wiring board) 51, that is, a plurality of the electrode pads (not shown in FIGS. 5A to 5E) formed on the pad forming surface are exposed from opening 16 in product forming region 51. Then, the electrode pads on first semiconductor chip 20 exposed from opening 16 in each product forming region 51 are connected to bond fingers 15 formed along opening 16 in product forming region 51 with conductive wires 42 made of Au or the like. In this case, first, one end portion of wire 42 is melted by a wire bonder (not shown) and a ball is formed at the tip end. The end portion having this ball formed is bonded on the electrode pad on first semiconductor chip 20 by ultrasonic thermocompression bonding, so that wire 42 is connected to the electrode pad. After that, the other end portion of wire 42 is bonded to corresponding bond finger 15 by ultrasonic thermocompression bonding while a predetermined loop shape is drawn, so that the electrode pad is electrically connected to bond finger 15. As described above, in this embodiment, first semiconductor chip 20 is wire-bonded before second semiconductor chip is mounted on the surface opposite to the pad forming surface of first semiconductor chip 20. Thus, it is possible to hold circuit motherboard 50 in the stable state using the surface opposite to the pad forming surface of first semiconductor chip 20, and to perform excellent wire bonding.

Figure 5B:
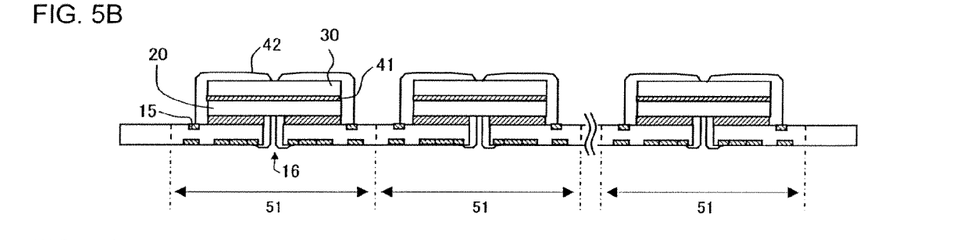

Subsequently, as shown in FIG. 5B, second semiconductor chip 30 is mounted on the surface opposite to the pad forming surface of first semiconductor chip 20 for stacking second semiconductor chip 30 on first semiconductor chip 20 by means of adhesive member 41 such as a DAF or the like. Then, by the method similar to first semiconductor chip 20, the electrode pads (not shown in FIGS. 5A to 5E) on second semiconductor chip 30 are connected to bond fingers 15 that are formed near the boundary of product forming region 51 with conductive wire 42 made of Au or the like. In addition, it is also possible to connect the electrode pads to bond fingers 15 with wire 42 by reverse bonding in order to lower the wire loop.

Figure 5C:
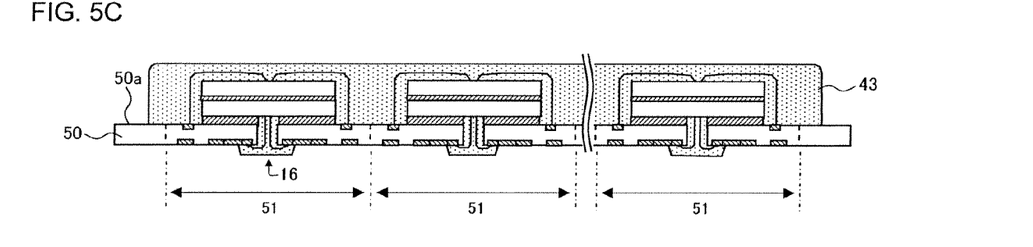

Subsequently, as shown in FIG. 5C, encapsulation element 43 is formed, which is made of an insulating resin, for collectively covering chip mounting surface 50a of circuit motherboard 50 and also for covering individual openings 16 in product forming regions 51.

In this case, first, circuit motherboard 50 is clamped with a mold composed of, for example, upper and lower molds of a transfer molder (not shown). A thermosetting epoxy resin is then pushed into a cavity formed between the upper and lower molds from a gate (not shown) and the resin is filled in the inside of the cavity for thermosetting, so that encapsulation element 43 is formed. In addition, the encapsulation resin is injected along the direction of extending elongated opening 16, so that it is possible to improve the filling properties of the encapsulation resin into opening 16.

Figures 5D, 5E:
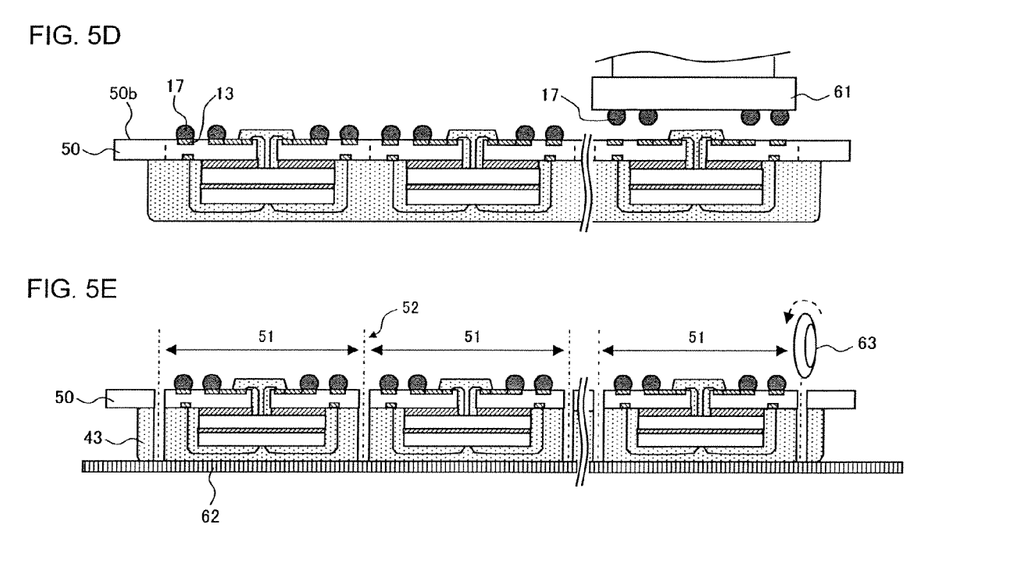

Subsequently, as shown in FIG. 5D, conductive solder ball 17 made of solder or the like is mounted on each of a plurality of lands 13 formed in a grid on electrode forming surface 50b of circuit motherboard 50. In this ball mount processing, ball mount tool 61 is used, which has a plurality of suction holes corresponding to the layout of lands 13 on circuit motherboard 50. Solder balls 17 are held on the suction holes, flux is transferred to held solder balls 17, and then solder balls 17 are collectively mounted on lands 13 on circuit motherboard 50. After being mounted, solder balls 17 are reflowed at a predetermined temperature, so that they are fixed to circuit motherboard 50. As described above, circuit motherboard 50, on which solder balls 17 are completely mounted on all of lands 13, is subjected to substrate dicing processing.

Subsequently, as shown in FIG. 5E, circuit motherboard 50 is cut along dicing lines 52, and separated into individual product forming regions 51. In this substrate dicing processing, first, encapsulation element 43 on circuit motherboard 50 is bonded to dicing tape 62 for supporting circuit motherboard 50 by dicing tape 62. Dicing blade 63 is then used to cut circuit motherboard 50 lengthwise and crosswise along dicing lines 52, and circuit motherboard 50 is separated into dies. After completion of die separation, the dies are picked up from dicing tape 62, so that it is possible to obtain a DDP semiconductor device as shown in FIG. 1.

Second Embodiment

Figure 6:
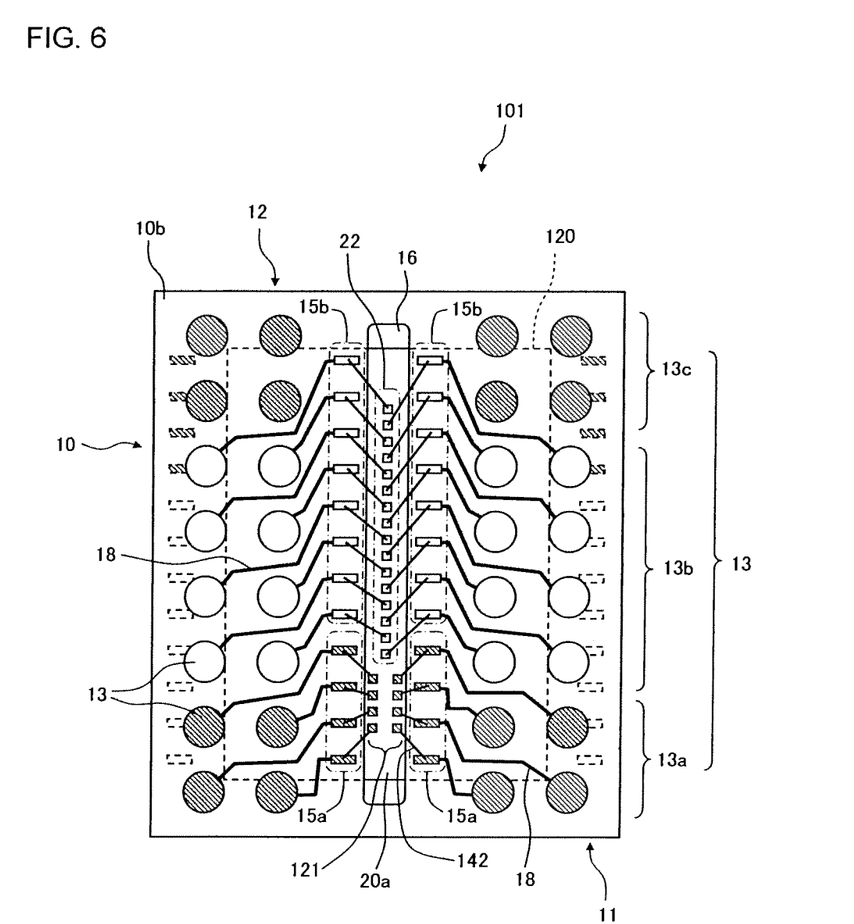
FIGS. 6 and 7 are plan views schematically showing a semiconductor device according to a second embodiment of the present invention.
Figure 7:
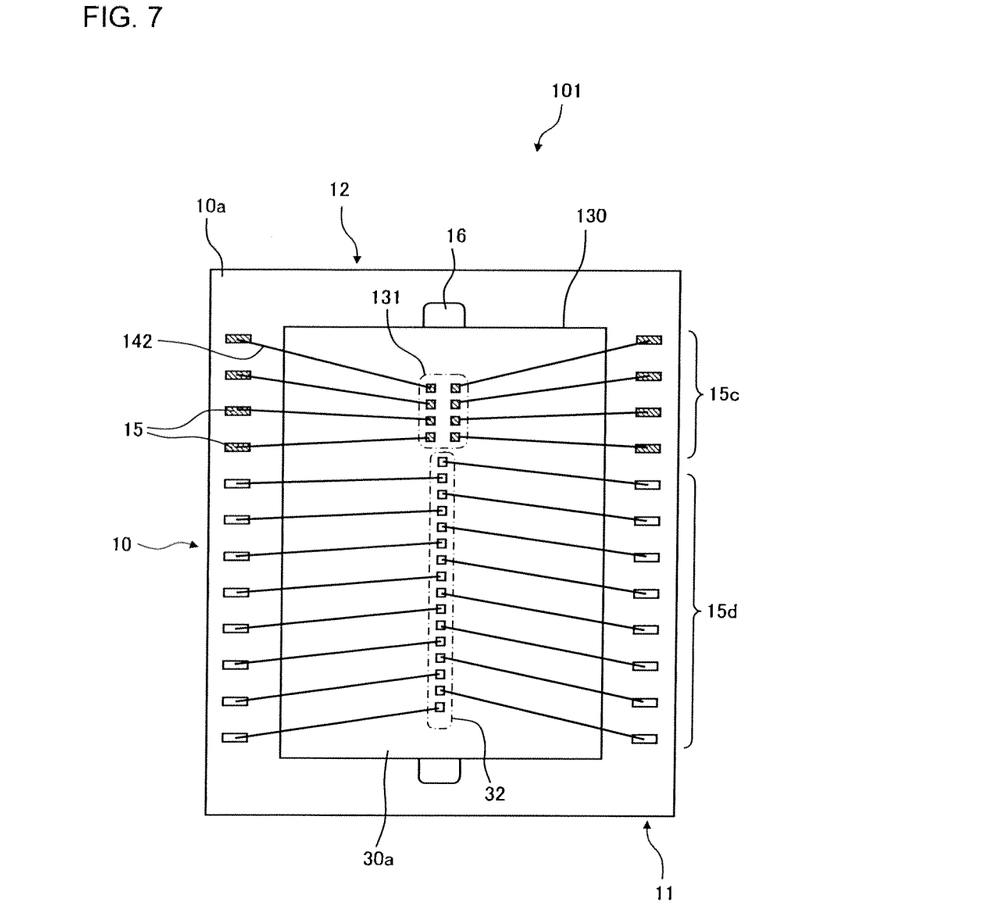

FIGS. 6 and 7 are plan views schematically showing a semiconductor device according to a second embodiment of the present invention, which correspond to FIGS. 2 and 3 in the first embodiment, respectively.

Semiconductor device 101 according to this embodiment is an exemplary modification in which the plan configurations of the I/O pads on semiconductor chips 20 and 30 are modified with respect to semiconductor device 1 according to the first embodiment. In the following, the same components as those in the first embodiment are designated the same reference numerals in the drawings for the purpose of omitting the descriptions.

In this embodiment, as shown in FIGS. 6 and 7, I/O pad rows 121 and 131 are each formed in two rows on semiconductor chips 120 and 130. In consequence, the configuration of wires 142 that connect these I/O pads 121 and 131 to bond fingers 15a and 15c on wiring board 10 is modified. The configurations other than these are the same as those in the first embodiment, and the effect obtained by this embodiment is also the same as that in the first embodiment. In addition to this, in this embodiment, it is possible to arrange a much greater number of external electrodes, or to reduce the size of the device. Moreover, I/O pad rows 121 and 131 are each formed in two rows, so that it is possible to facilitate wire routing between I/O pads 121 and 131 and bond fingers 15a and 15c as compared with that in the first embodiment as well as to shorten the individual wire lengths. Accordingly, it is also advantageous in that it is possible to reduce the occurrence of wire sweep.

Third Embodiment

Next, a semiconductor device according to a third embodiment of the present invention will be described with reference to FIGS. 8 to 10.

This embodiment is an exemplary modification in which the direction of disposing the first semiconductor chip 20 is changed with respect to the first embodiment. With this change, in this embodiment, it is unnecessary to form the opening provided in the wiring board of the above-mentioned embodiments, as will be described later. Because of this, in the semiconductor device according to this embodiment, it is possible to improve the filling properties of the encapsulation element covering the semiconductor chips, and to eliminate the occurrence of voids that are possibly produced in the encapsulation element near the opening. Thus, this embodiment is more advantageous than the above-mentioned embodiments.

Figure 8:
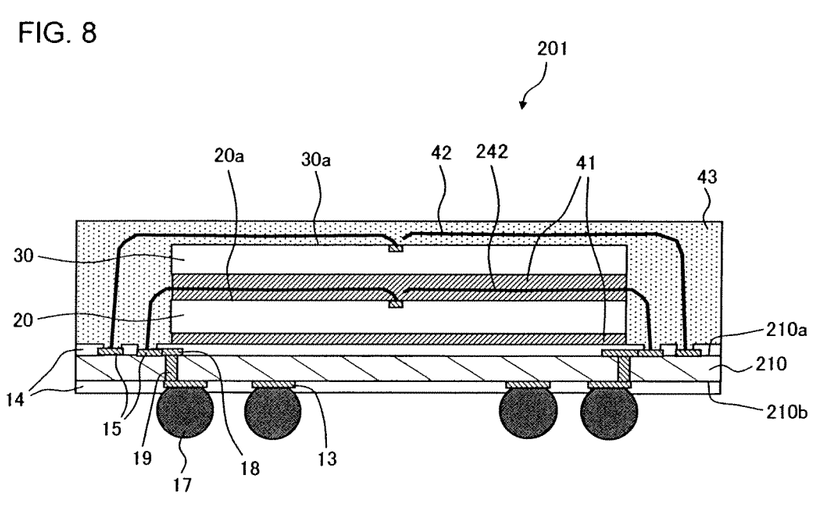
FIG. 8 is a cross sectional view schematically showing a semiconductor device according to a third embodiment of the present invention.

FIG. 8 is a cross sectional view schematically showing the semiconductor device according to this embodiment, which corresponds to FIG. 1 in the first embodiment. FIG. 9A is a plan view schematically showing the semiconductor device shown in FIG. 8, which corresponds to FIG. 3 in the first embodiment. FIG. 9B is a diagram that omits the configurations relating to the configuration of second semiconductor chip 30 from the plan view of FIG. 9A in order to show the configuration of first semiconductor chip 20. FIG. 10 is a diagram schematically showing the connections between bond fingers and lands, which is a schematic plan view showing the semiconductor device according to this embodiment corresponding to FIG. 4 of the first embodiment.

In this embodiment, as shown in FIG. 8, first semiconductor chip 20 is mounted on wiring board 210 in such way that the surface on which the electrode pad rows on first semiconductor chip 20 are not formed, in other words, the surface that is opposite to pad forming surface 20a, is arranged to face chip mounting surface 210a of wiring board 210. In contrast to this, second semiconductor chip 30 is mounted on first semiconductor chip 20 in such a way that the surface opposite to pad forming surface 30a is arranged to face first semiconductor chip 20 similar to the first embodiment.

Figure 9A:
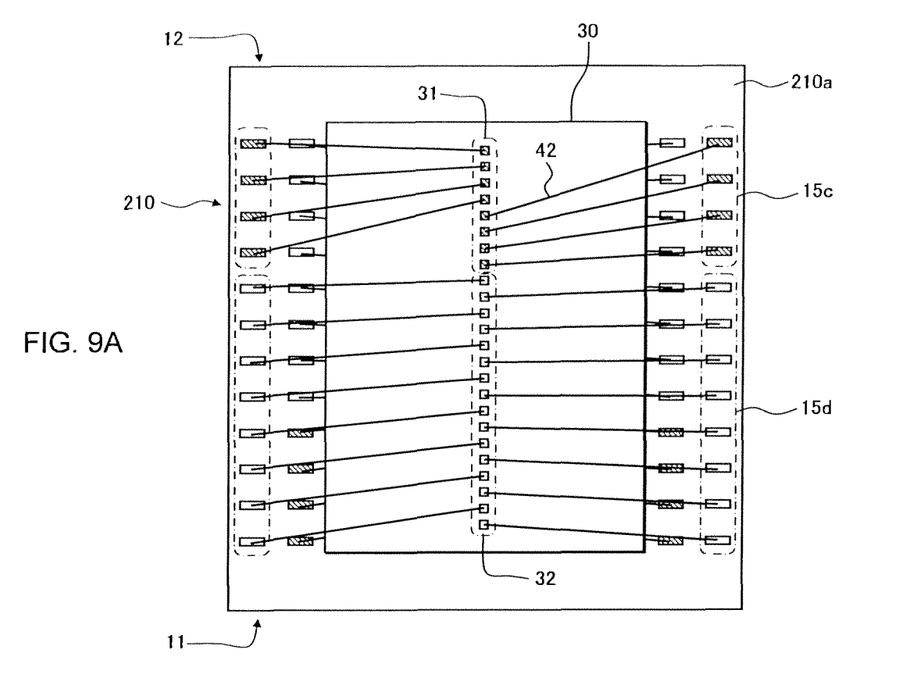
Figure 9B:
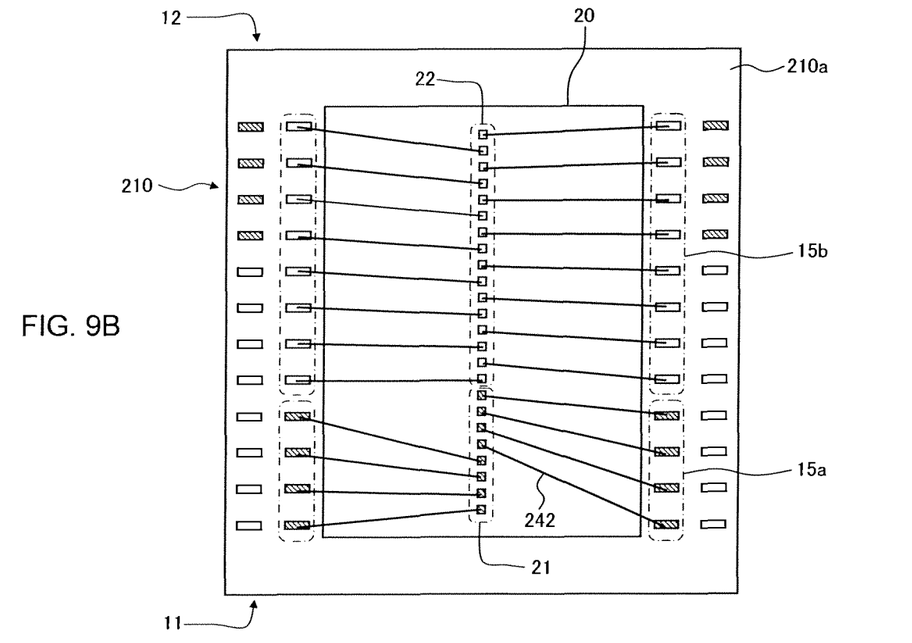
Figure 10:
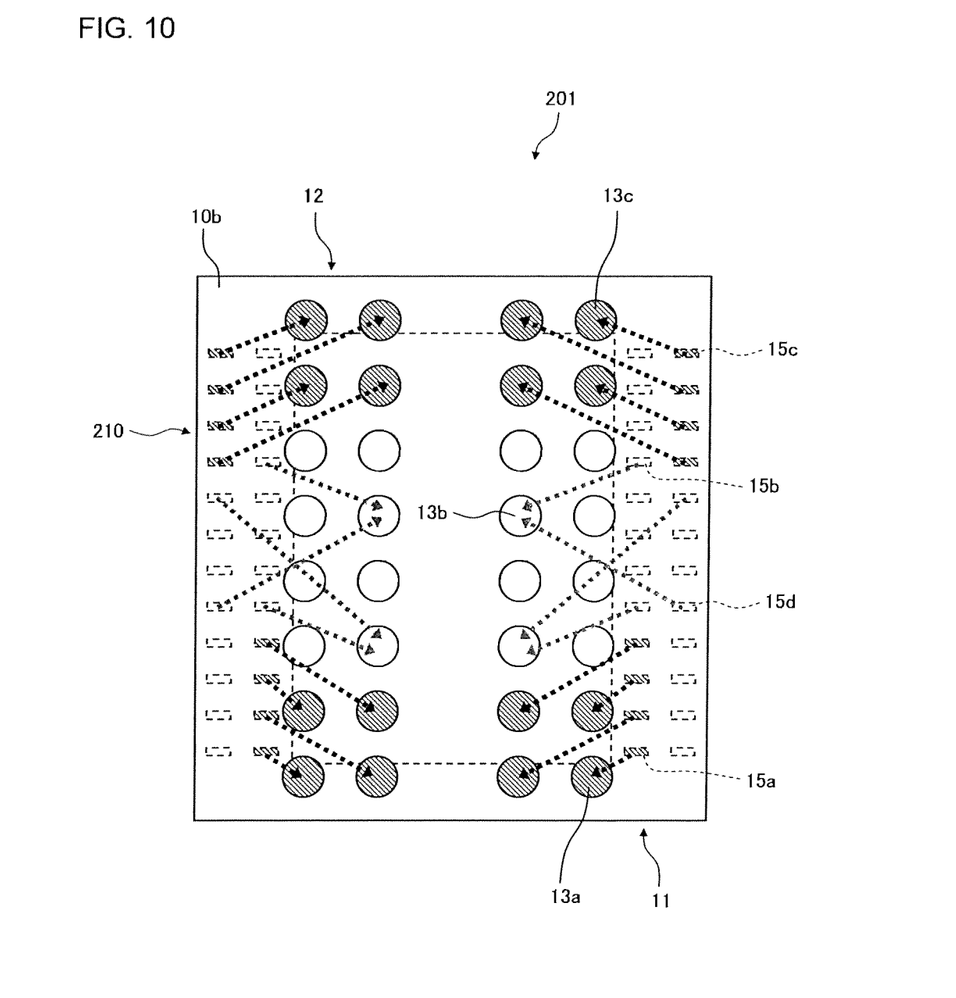

With the change in the direction of disposing first semiconductor chip 20, bond fingers 15a and 15b that are connected to electrode pad rows 21 and 22 on first semiconductor chip 20 are formed on chip mounting surface 210a so as to be arranged in parallel with bond fingers 15c and 15d for second semiconductor chip 30 as shown in FIGS. 9A and 9B. Thus, in this embodiment, as shown in FIG. 10, any one of bond fingers 15a to 15d are routed in predetermined wiring patterns on chip mounting surface 210a, and are electrically connected to lands 13a to 13c on electrode forming surface 210b via through vias. Moreover, as shown in FIG. 8, wires 242 that connect electrode pad rows 21 and 22 on first semiconductor chip 20 to bond fingers 15a and 15b on chip mounting surface 210a are arranged so as to be buried in the encapsulation element between first semiconductor chip 20 and second semiconductor chip 30.

As described above, semiconductor device 201 according to this embodiment differs from the first embodiment in that the direction of disposing first semiconductor chip 20 is different. On the other hand, the layout of I/O pad rows 21 and 31 and I/O lands 13a and 13c on semiconductor chips 20 and 30 are the same as those in the first embodiment. Because of this, also in this embodiment, it is possible to obtain the effect similar to that of the first embodiment. In addition, as discussed above, wires 242 that connect to first semiconductor chip 20 are configured to be buried between first semiconductor chip 20 and second semiconductor chip 30, so that it is possible to reduce the occurrence of wire sweep or wire short circuits in forming (molding) the encapsulation element. Thus, it is also possible to improve the reliability of the semiconductor device.

As discussed above, the specific configurations of the semiconductor device according to the present invention are described. However, It is apparent that the present invention is not limited to the above embodiments, but may be modified and changed without departing from the scope and spirit of the invention. For example, in the embodiments, the case is described in which a glass epoxy base material is used for the wiring board for use in the semiconductor device. However, it is also possible to form the semiconductor device according to the present invention using a flexible wiring board made of a polyimide base material.

What is claimed is:

1. A semiconductor device comprising:
   a substrate having an upper surface and a lower surface opposite to the upper surface, the substrate being defined by first and second sides opposite to each other and by third and fourth sides opposite to each other, the substrate further comprising a plurality of first and second bond fingers and a plurality of first and second lands, the plurality of first and second bond fingers each including a plurality of first and second input/output (I/O) bond fingers, and the plurality of first and second lands each including a plurality of first and second I/O lands;
   a first semiconductor chip stacked on the upper surface of the substrate, the first semiconductor chip having a first end portion near the first side of the substrate and a second end portion near the second side of the substrate, the first semiconductor chip comprising a plurality of first electrode pads disposed along a line extending between the first and second end portions of the first semiconductor chip and being parallel to the third and fourth sides of the substrate, the plurality of first electrode pads including a plurality of first I/O electrode pads and a plurality of first command and address (CA) electrode pads, the plurality of first I/O electrode pads arranged on the first end portion;
   each one of the plurality of first I/O bond fingers being connected to a corresponding one of the plurality of first I/O electrode pads, the plurality of first I/O bond fingers arranged next to the first I/O electrode pads and arranged near the first side of the substrate;
   each one of the plurality of first I/O lands being connected to a corresponding one of the plurality of first I/O bond fingers, the plurality of first I/O lands arranged next to the plurality of first I/O bond fingers and arranged near the first side of the substrate;
   a second semiconductor chip stacked on the first semiconductor chip, the second semiconductor chip having a third end portion near the first side of the substrate and a fourth end portion near the second side of the substrate, the second semiconductor chip comprising a plurality of second electrode pads disposed along a line extending between the third and fourth end portions of the second semiconductor chip and being parallel to the third and fourth sides of the substrate, the plurality of second electrode pads including a plurality of second I/O electrode pads and a plurality of second CA electrode pads, the plurality of second I/O electrode pads arranged on the fourth end portion;

each one of the plurality of second I/O bond fingers being connected to a corresponding one of the plurality of second I/O electrode pads, the plurality of second I/O bond fingers arranged next to the second I/O electrode pads and arranged near the second side of the substrate; and each one of the plurality of second I/O lands being connected to a corresponding one of the plurality of second I/O bond fingers, the plurality of second I/O lands arranged next to the plurality of second I/O bond fingers and arranged near the second side of the substrate, wherein an edge of the first end portion of the first semiconductor chip substantially aligns with an edge of the third end portion of the second semiconductor chip in a stacking direction of the first and second semiconductor chips.

2. The semiconductor device according to claim 1, further comprising:

a rectangular opening formed in the substrate, the rectangular opening being arranged along a center line between the first and the second sides of the substrate, and being parallel to the third and fourth sides of the substrate.

3. The semiconductor device according to claim 2, wherein the plurality of first bond fingers are arranged on the lower surface of the substrate on both sides of and near edges of the rectangular opening.

4. The semiconductor device according to claim 1, wherein the plurality of second bond fingers are arranged on the upper surface of the substrate in two rows near the third and fourth sides of the substrate.

5. The semiconductor device according to claim 2, wherein:

the plurality of first electrode pads are disposed on a surface of the first semiconductor chip facing the substrate and arranged inside the rectangular opening; and the plurality of second electrode pads are disposed on an upper surface of the second semiconductor chip opposing the first semiconductor chip.

6. The semiconductor device according to claim 1, wherein:

the plurality of first bond fingers further include a plurality of first CA bond fingers, each one of the plurality of first CA bond fingers being connected to a corresponding one of the plurality of first CA electrode pads, the plurality of first CA bond fingers arranged next to the first CA electrode pads and arranged near the second side of the substrate; and the plurality of second bond fingers further include a plurality of second CA bond fingers, each one of the plurality of second CA bond fingers being connected to a corresponding one of the plurality of second CA electrode pads, the plurality of second CA bond fingers arranged next to the second CA electrode pads and arranged near the first side of the substrate.

7. The semiconductor device according to claim 6, wherein:

the plurality of first CA electrode pads on the first semiconductor chip are coupled to a corresponding one of the plurality of first CA bond fingers; and the plurality of second CA electrode pads on the second semiconductor chip are coupled to a corresponding one of the plurality of second CA bond fingers.

8. The semiconductor device according to claim 1, wherein:

the plurality of first I/O lands are arranged for I/O signal wirings from the first semiconductor chip; and the plurality of second I/O lands are arranged for I/O signal wirings from the second semiconductor chip.

9. The semiconductor device according to claim 8, wherein the I/O signal wirings from the first semiconductor chip are substantially equal in length with that of the I/O signal wirings from the second semiconductor chip.

10. The semiconductor device according to claim 1, wherein the first semiconductor chip is bonded to the substrate by means of adhesive member.

11. The semiconductor device according to claim 2, further comprising an encapsulation element covering the upper surface of the substrate, the first and the second semiconductor chips, and the rectangular opening.

12. The semiconductor device according to claim 1, wherein the plurality of first I/O electrode pads and the plurality of second I/O electrode pads are each arranged in one row on the first semiconductor chip and the second semiconductor chip respectively.

13. The semiconductor device according to claim 1, wherein the plurality of first I/O electrode pads and the plurality of second I/O electrode pads are each arranged in two rows on the first semiconductor chip and the second semiconductor chip respectively, the two rows being in parallel with the third and fourth sides of the substrate.

14. The semiconductor device according to claim 13, wherein a rectangular opening is formed in the substrate, the rectangular opening being arranged along a center line between the first and the second sides of the substrate, and being parallel to the third and fourth sides of the substrate.

15. The semiconductor device according to claim 14, wherein:

the plurality of first bond fingers are arranged on the lower surface of the substrate on both sides of and near edges of the rectangular opening; and the plurality of second bond fingers are arranged on the upper surface of the substrate in two rows near the third and fourth sides of the substrate.

16. The semiconductor device according to claim 14, wherein:

the plurality of first electrode pads are disposed on a surface of the first semiconductor chip facing the substrate and arranged inside the rectangular opening; and the plurality of second electrode pads are disposed on an upper surface of the second semiconductor chip opposing the first semiconductor chip.

17. The semiconductor device according to claim 13, wherein:

the plurality of first bond fingers further include a plurality of first CA bond fingers, each one of the plurality of first CA bond fingers being connected to a corresponding one of the plurality of first CA electrode pads, the plurality of first CA bond fingers arranged next to the first CA electrode pads and arranged near the second side of the substrate; and the plurality of second bond fingers further include a plurality of second CA bond fingers, each one of the plurality of second CA bond fingers being connected to a corresponding one of the plurality of second CA electrode pads, the plurality of second CA bond fingers arranged next to the second CA electrode pads and arranged near the first side of the substrate.

18. The semiconductor device according to claim 13, wherein:
the plurality of first I/O lands are arranged for I/O signal wirings from the first semiconductor chip;
the plurality of second I/O lands are arranged for I/O signal wirings from the second semiconductor chip; and
the I/O signal wirings from the first semiconductor chip are substantially equal in length with that of the I/O signal wirings from the second semiconductor chip.

19. The semiconductor device according to claim 13, wherein the first semiconductor chip is bonded to the substrate by means of adhesive member.

20. The semiconductor device according to claim 14, further comprising an encapsulation element covering the upper surface of the substrate, the first and the second semiconductor chips, and the rectangular opening.

* * * * *